(12) United States Patent
Wan et al.

(10) Patent No.: US 11,016,548 B2
(45) Date of Patent: May 25, 2021

(54) SINGLE CHIP SYSTEM AND RESET METHOD FOR SINGLE CHIP SYSTEM

(71) Applicant: SHENZHEN GOODIX TECHNOLOGY CO., LTD., Shenzhen (CN)

(72) Inventors: Peng Wan, Shenzhen (CN); Xingbao Yang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 478 days.

(21) Appl. No.: 15/803,749

(22) Filed: Nov. 4, 2017

(65) Prior Publication Data

US 2018/0081411 A1    Mar. 22, 2018

Related U.S. Application Data

(63) Continuation of application No. PCT/CN2016/099598, filed on Sep. 21, 2016.

(51) Int. Cl.
*G06F 1/24* (2006.01)
*H03K 17/22* (2006.01)
(Continued)

(52) U.S. Cl.
CPC .............. *G06F 1/24* (2013.01); *G06F 1/3206* (2013.01); *G06F 1/3243* (2013.01); *G06F 1/3287* (2013.01); *H03K 17/22* (2013.01)

(58) Field of Classification Search
CPC ......... G06F 1/24; G06F 1/3206; G06F 1/3243
See application file for complete search history.

(56) References Cited

U.S. PATENT DOCUMENTS

2003/0233156 A1* 12/2003 Pihet .................. G05B 19/0428
700/79
2008/0030245 A1    2/2008 Elrod et al.
(Continued)

FOREIGN PATENT DOCUMENTS

CN    201035573 Y    3/2008
CN    101154179 A    4/2008
(Continued)

OTHER PUBLICATIONS

International Search Report for International Application No. PCT/CN2016/099598, Applicant: Shenzhen Goodix Technology Co., Ltd., dated Jun. 30, 2017, 5 pages.

*Primary Examiner* — Vincent H Tran
(74) *Attorney, Agent, or Firm* — Scully Scott Murphy & Presser (57) ABSTRACT

A single chip system is disclosed, which includes: a reset pin (110), a control unit (120), a central processing unit CPU (130) and a peripheral (140), the single chip system (100) is connected to a master control system (200) via an end of the reset pin (110), the other end of the reset pin (110) is connected to the control unit (120), and the control unit (120) is connected to the CPU (130) and the peripheral (140), where the master control system (200) controls the reset pin (110) to output a reset electrical level; and the control unit (120) detects a signal duration of the reset electrical level output by the reset pin (110), and trigger to wake or reset a single chip according to the signal duration of the reset electrical level, a signal duration for triggering wakeup is different from a signal duration for triggering a reset.

8 Claims, 5 Drawing Sheets

(51) Int. Cl.
  *G06F 1/3206*  (2019.01)
  *G06F 1/3234*  (2019.01)
  *G06F 1/3287*  (2019.01)

(56) References Cited

U.S. PATENT DOCUMENTS

| | | |
|---|---|---|
| 2008/0195883 A1 | 8/2008 | Lee et al. |
| 2010/0005231 A1 | 1/2010 | Lee et al. |
| 2015/0022382 A1 | 1/2015 | Chettimada et al. |
| 2015/0097726 A1* | 4/2015 | Babitch ............... G01S 19/235 342/357.62 |
| 2015/0339257 A1 | 11/2015 | Hug et al. |
| 2016/0085279 A1* | 3/2016 | Culshaw .................. G06F 1/24 327/142 |
| 2017/0242130 A1 | 8/2017 | Babitch et al. |

FOREIGN PATENT DOCUMENTS

| | | |
|---|---|---|
| CN | 101706674 A | 5/2010 |
| CN | 102270029 A | 12/2011 |
| CN | 102508533 A | 6/2012 |
| CN | 103105915 A | 5/2013 |
| CN | 104317728 A | 1/2015 |
| CN | 104396179 A | 3/2015 |
| EP | 3046034 A1 | 7/2016 |
| JP | 9-73404 A | 3/1997 |
| KR | 10-20140135767 A | 11/2014 |
| KR | 20150041744 A | 4/2015 |
| WO | 2013178274 A1 | 12/2013 |

* cited by examiner

SINGLE CHIP SYSTEM AND RESET METHOD FOR SINGLE CHIP SYSTEM

CROSS REFERENCE TO RELATED APPLICATIONS

The present application is a continuation of international application No. PCT/CN2016/099598 filed on Sep. 21, 2016 and entitled "SINGLE CHIP SYSTEM AND RESET METHOD FOR SINGLE CHIP SYSTEM", which is hereby incorporated by reference in its entirety.

TECHNICAL FIELD

The present disclosure relates to the field of computers, and more specifically, to a single chip system and a reset method for the single chip system.

BACKGROUND

A single chip is a complete computer system integrated into a chip. Generally, the single chip may save power consumption in a standby state through a sleep mode. When the single chip is required to recover from a sleep mode to a working mode, it may be realized in one of two manners, namely wakeup and a reset, where the wakeup may quickly wake a Central Processing Unit ("CPU" for short) so as to make the single chip start working, while the reset requires that a chip be restored to a complete initial state and the CPU restart operating, so that the working mode is entered after a series of initialization states are carried out on the chip. A user may make a single chip in a sleep mode re-enter a working mode according to his or her own requirement in one of the two manners of wakeup and reset.

In the related art, wakeup and a reset of a single chip are controlled by different Input/Output ("I/O" for short) interface pins, respectively. For example, the wakeup may be controlled by detecting whether a specified change occurs in an electrical level of a general I/O interface (e.g., waking a CPU when a low electrical level is detected), and the reset may make the single chip to be reset globally by operating a reset pin (e.g., by controlling a change in an electrical level). However, an I/O interface is a very precious resource for the single chip, while adopting two separate I/O interface pins to respectively control the single chip to re-enter the working mode causes relatively large system resource consumption.

SUMMARY

Embodiments of the present disclosure provide a single chip system and a reset method for the single chip system, and thus by detecting a reset pulse width of a reset pin to determine whether to wake or reset a single chip, two functions of wakeup and reset are realized via one reset pin without increasing a system resource.

According to a first aspect, a single chip system is provided, including: a reset pin, a control unit, a central processing unit (CPU) and a peripheral, the single chip system is connected to a master control system via an end of the reset pin, the other end of the reset pin is connected to the control unit, and the control unit is connected to the CPU and the peripheral, respectively, where the master control system is configured to control the reset pin to output a reset electrical level; and the control unit is configured to detect a signal duration of the reset electrical level output by the reset pin, and trigger waking or resetting a single chip according to the signal duration of the reset electrical level, a signal duration for triggering wakeup is different from a signal duration for triggering a reset.

Therefore, in the single chip system of an embodiment of the present disclosure, by detecting, by a control unit, a signal duration of a reset electrical level, and sending a wakeup instruction or a reset instruction according to the signal duration so as to wake a single chip or reset the single chip, two functions of wakeup and reset are realized simultaneously via one reset pin without increasing a system resource, thus saving system consumption and space of a PCB.

With reference to the first aspect, in a first possible implementation manner of the first aspect, the control unit is specifically configured to: send a wakeup instruction when it is detected during a first time period that the reset pin continuously outputs the reset electrical level, the wakeup instruction is used to trigger the CPU to wake the single chip system, where a start time of the first time period is a start time of the reset electrical level output by the reset pin, and a duration of the first time period is a preset first threshold value; and send a reset instruction when it is detected during a second time period that the reset pin continuously outputs the reset electrical level, the reset instruction including a first reset instruction and a second reset instruction, the first reset instruction is used to trigger the CPU to be reset, and the second reset instruction is used to trigger the peripheral to be reset, where a start time of the second time period is a start time of the reset electrical level output by the reset pin, and a duration of the second time period is a preset second threshold value.

With reference to the first aspect, in a second possible implementation manner of the first aspect, the control unit is specifically configured to: send a wakeup instruction when it is detected that a duration between a start time and an end time of the reset electrical level output by the reset pin is greater than or equal to a preset first threshold value and smaller than a preset second threshold value, the wakeup instruction is used to trigger the CPU to wake the single chip system, and the second threshold value is greater than the first threshold value; or send a reset instruction when it is detected that a duration between the start time and the end time of the reset electrical level output by the reset pin is greater than or equal to the second threshold value, the reset instruction including a first reset instruction and a second reset instruction, the first reset instruction is used to trigger the CPU to be reset, and the second reset instruction is used to trigger the peripheral to be reset. With reference to the first aspect and the above possible implementation manners thereof, in a third possible implementation manner of the first aspect, the wakeup instruction is a first pulse signal, and the first reset instruction is a second pulse signal, the first pulse signal and the second pulse signal having different waveforms so as to differentiate the wakeup instruction from the first reset instruction.

Different instructions are differentiated through pulse signals of different forms, which facilitates a CPU differentiating different instructions so as to execute corresponding actions. In addition, a wakeup instruction and a reset instruction may be transmitted via only one control path, thus reducing a number of control paths.

With reference to the first aspect and the above possible implementation manners thereof, in a fourth possible implementation manner of the first aspect, the wakeup instruction is a first pulse signal, the first reset instruction is a second pulse signal, the first pulse signal and the second pulse signal are the same, and the control unit is specifically configured to send the first pulse signal via a first control path, and send the second pulse signal via a second control path.

Sending different instructions via two different control paths enables a CPU to differentiate instructions according to different interfaces when receiving the instructions, and execute corresponding actions, and this is simple and convenient, and is easy to be realized.

With reference to the first aspect and the above possible implementation manners thereof, in a fifth possible implementation manner of the first aspect, the control unit includes a reset pulse width detector and a reset control unit, the reset pulse width detector is configured to: detect a signal duration of a reset electrical level output by the reset pin, and send a wakeup instruction to the CPU according to the signal duration of the reset electrical level so as to trigger the CPU to wake the single chip system, or send a third reset instruction to the reset control unit so as to trigger the reset control unit to reset the single chip system; and the reset control unit is configured to send the first reset instruction to the CPU and send the second reset instruction to the peripheral based on the third reset instruction, the first reset instruction is used to trigger the CPU to be reset, and the second reset instruction is used to trigger the peripheral to be reset.

According to a second aspect, a reset method for a single chip system is provided, where the single chip system includes: a reset pin, a control unit, a central processing unit (CPU) and a peripheral, the single chip system is connected to a master control system via an end of the reset pin, the other end of the reset pin is connected to the control unit, and the control unit is connected to the CPU and the peripheral, respectively; and the reset method includes:

controlling, by the master control system, the reset pin to output a reset electrical level;

detecting, by the control unit, a signal duration of the reset electrical level output by the reset pin; and triggering, by the control unit, waking or resetting the single chip system according to the signal duration of the reset electrical level, where a signal duration for triggering wakeup is different from a signal duration for triggering a reset.

Therefore, in the reset method for a single chip system of an embodiment of the present disclosure, by detecting, by a control unit, a signal duration of a reset electrical level, and sending a wakeup instruction or a reset instruction according to the signal duration so as to wake a single chip or reset the single chip, two functions of wakeup and reset are realized simultaneously via one reset pin without increasing a system resource, thus saving system consumption and space of a PCB.

With reference to the second aspect, in a first possible implementation manner of the second aspect, the triggering, by the control unit, waking or resetting the single chip system according to the signal duration of the reset electrical level includes:

sending, by the control unit, a wakeup instruction when it is detected during a first time period that the reset pin continuously outputs the reset electrical level, the wakeup instruction is used to trigger the CPU to wake the single chip system, where a start time of the first time period is a start time of the reset electrical level output by the reset pin, and a duration of the first time period is a preset first threshold value; and sending, by the control unit, a reset instruction when it is detected during a second time period that the reset pin continuously outputs the reset electrical level, the reset instruction including a first reset instruction and a second reset instruction, the first reset instruction is used to trigger the CPU to be reset, and the second reset instruction is used to trigger the peripheral to be reset, where a start time of the second time period is a start time of the reset electrical level output by the reset pin, and a duration of the second time period is a preset second threshold value.

With reference to the second aspect, in a second possible implementation manner of the second aspect, the triggering, by the control unit, waking or resetting the single chip system according to the signal duration of the reset electrical level includes:

sending, by the control unit, a wakeup instruction when it is detected that a duration between a start time and an end time of the reset electrical level output by the reset pin is greater than or equal to a preset first threshold value and smaller than a preset second threshold value, the wakeup instruction is used to trigger the CPU to wake the single chip system, and the second threshold value is greater than the first threshold value; or sending a reset instruction when it is detected that a duration between the start time and the end time of the reset electrical level output by the reset pin is greater than or equal to the second threshold value, the reset instruction including a first reset instruction and a second reset instruction, the first reset instruction is used to trigger the CPU to be reset, and the second reset instruction is used to trigger the peripheral to be reset.

With reference to the second aspect and the above possible implementation manners thereof, in a third possible implementation manner of the second aspect, the wakeup instruction is a first pulse signal, and the first reset instruction is a second pulse signal, the first pulse signal and the second pulse signal having different waveforms so as to differentiate the wakeup instruction from the first reset instruction.

Different instructions are differentiated through pulse signals of different forms, which facilitates a CPU differentiating different instructions so as to execute corresponding actions. In addition, a wakeup instruction and a reset instruction may be transmitted via only one control path, thus reducing a number of control paths.

With reference to the second aspect and the above possible implementation manners thereof, in a fourth possible implementation manner of the second aspect, the wakeup instruction is a first pulse signal, and the first reset instruction is a second pulse signal, the first pulse signal and the second pulse signal are the same;

the sending the wakeup instruction includes:

sending the first pulse signal via a first control path; and the sending the first reset instruction includes:

sending the second pulse signal via a second control path.

Sending different instructions via two different control paths enables a CPU to differentiate instructions according to different interfaces when receiving the instructions, and execute corresponding actions, and this is simple and convenient, and is easy to be realized.

With reference to the second aspect and the above possible implementation manners thereof, in a fifth possible implementation manner of the second aspect, the control unit includes a reset pulse width detector and a reset control unit;

the detecting, by the control unit, the signal duration of the reset electrical level output by the reset pin includes:

detecting, by the reset pulse width detector, a signal duration of the reset electrical level output by the reset pin; and the triggering, by the control unit, waking or resetting the single chip system according to the signal duration of the reset electrical level includes:

sending, by the reset pulse width detector, a wakeup instruction to the CPU according to the signal duration of the reset electrical level so as to trigger the CPU to wake the single chip system, or sending a third reset instruction to the reset control unit so as to trigger the reset control unit to reset the single chip system; and sending, by the reset control unit, a first reset instruction to the CPU and sending a second reset instruction to the peripheral based on the third reset instruction, the first reset instruction is used to trigger the CPU to be reset, and the second reset instruction is used to trigger the peripheral to be reset.

According to a third aspect, a computer storage medium is provided, where the computer storage medium stores a program code for indicating executing an operation executed by the single chip system in the above first aspect or any optional implementation manner of the first aspect.

Therefore, according to a single chip system and a reset method for the single chip system of the embodiments of the present disclosure, by detecting a reset pulse width of a reset pin to send a wakeup instruction or a reset instruction so as to determine whether to wake or reset a single chip, two functions of wakeup and reset can be realized via one reset pin without increasing a system resource.

BRIEF DESCRIPTION OF DRAWINGS

To describe the technical solutions in the embodiments of the present disclosure more clearly, the following briefly describes the accompanying drawings required for describing the embodiments or the related art. Apparently, the accompanying drawings in the following description are merely some embodiments of the present disclosure, and other drawings may also be obtained based on these drawings by a person of ordinary skill in the art without involving inventive efforts.

DESCRIPTION OF EMBODIMENTS

The following clearly describes the technical solutions in the embodiments of the present disclosure with reference to the accompanying drawings in the embodiments of the present disclosure. Apparently, the described embodiments are merely some but not all of the embodiments of the present disclosure. All of other embodiments, obtained by a person of ordinary skill in the art based on the embodiments of the present disclosure without involving inventive efforts, fall into the protection scope of the present disclosure.

It should be understood that a designated I/O interface may be generally used to wake a single chip in the related art. Specifically, when the single chip is in a sleep mode, a detection circuit in the single chip will detect states of electrical levels of all I/O interfaces, and if a preset change (e.g., detecting a low electrical level) occurs in an electrical level of the specified I/O interface, the detection circuit will wake a CPU so as to make it start working. An advantage of this method is that the single chip can be waken quickly, but the system is required to provide a general I/O interface for wakeup; in addition, an I/O interface is a very precious resource for the single chip, while this design increases consumption of system resource and space of a Printed Circuit Board (PCB for short).

On the other hand, a reset pin of the single chip may be used for a global reset of the single chip. Specifically, when the reset pin of the single chip is operated so as to cause a specified change (e.g., outputting a low electrical level) to occur in an electrical level thereof, the reset pin will notify the CPU and a peripheral to restart operating, and the single chip system enters a working mode after a series of initialization.

Therefore, two functions of wakeup and reset through which a user controls a single chip to enter a working mode from a sleep mode need to be controlled by two separate I/O interface pins, respectively, thus increasing consumption of system resource and space of a PCB.

In view of this, the present application provides a single chip system and a reset method for the single chip system, in which two functions of wakeup and reset can be realized via a single I/O interface pin, thus saving system resource consumption and space of a PCB.

A single chip system of embodiments of the present disclosure is explained below in detail with reference to FIG. 1 and FIG. 2.

Figure 1:
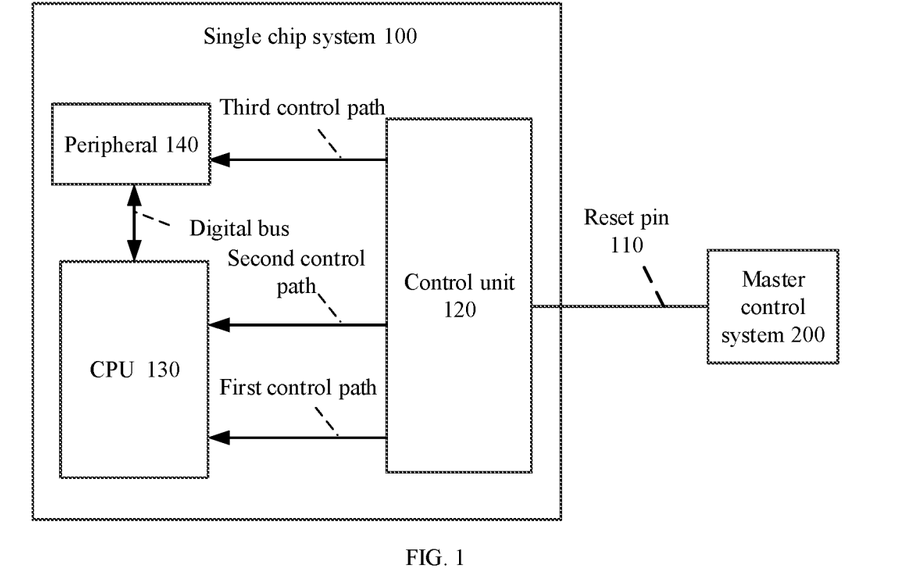
FIG. 1 is a schematic block diagram of a single chip system according to an embodiment of the present disclosure.

FIG. 1 is a schematic block diagram of a single chip system 100 according to an embodiment of the present disclosure. As shown in FIG. 1, the single chip system 100 includes a reset pin 110, a control unit 120, a Central Processing Unit ("CPU" for short) 130 and a peripheral 140, where the reset pin 110 may be regarded as an interface via which an I/O interface is connected to the outside. An end of the reset pin 110 is connected to a master control system 200, and the other end of the reset pin 110 is connected to the control unit 120. The control unit 120 can be connected to the CPU 130 and the peripheral 140 via different control paths so as to send instructions to the CPU 130 and the peripheral 140 via the control paths. Specifically, the control paths may be metal wires. The CPU 130 may be connected to the peripheral 140 via a digital bus. Specifically, the peripheral 140 may include, for example, a timer, a Direct Memory Access ("DMA" for short) controller and some I/O interfaces, etc.

The master control system 200 is configured to control the reset pin 110 to output a reset electrical level, and the control unit 120 is configured to detect a signal duration of the reset electrical level output by the reset pin, and trigger waking or resetting the single chip system 100 according to the signal duration of the reset electrical level.

Moreover, a signal duration for triggering wakeup is different from a signal duration for triggering a reset, and the control unit 120 may trigger a CPU to be waken and reset and trigger a peripheral to be reset according to different signal durations.

Here, it should be noted that a reset of a single chip system includes a CPU reset and a peripheral reset, for which reset instructions may be sent by a control unit, respectively. For convenience of differentiation and explanation, a reset instruction sent by the control unit to a CPU is designated as a first reset instruction, and a reset instruction sent by the control unit to a peripheral is designated as a second reset instruction. Unlike this, wakeup of the single chip system may be implemented by waking the peripheral via the CPU, and at this moment, the control unit may send a wakeup instruction directed to the CPU.

It should be further noted that the above-mentioned master control system 200 may be regarded as another single chip for controlling the single chip previously mentioned, and for convenience of differentiation and explanation, the former single chip may be designated as a single chip A which may be regarded as a slave, and the latter single chip may be designated as a single chip B which may be regarded as a host. That is to say, the single chip B (e.g., the single chip system 100 of an embodiment of the present disclosure) is used to control the single chip A to be waken or reset. Hereinafter, unless otherwise specified, a single chip system described in the embodiments of the present disclosure represents a slave (i.e., being able to be understood as the above-mentioned single chip A) controlled by a host (i.e., being able to be understood as the above-mentioned single chip B) for convenience of explanation.

It should be further noted that the reset pin 110 may be connected to the master control system 200. The master control system 200 may either be a system disposed inside the single chip system 100, or be an external system disposed outside the single chip system 100, and this is not particularly limited in the present disclosure. As long as the master control system 200 realizes waking or resetting a single chip system by controlling the reset pin to output a high electrical level or a low electrical level, it shall fall into the protection scope of the present disclosure.

It should be further noted that, in general, a reset pin outputs a high electrical level when a single chip is in a working mode or a sleep mode, and when it is required to trigger the single chip to recover from the sleep mode to the working mode, the single chip may be triggered to be waken or reset by means of pulling down an electrical level of the reset pin (i.e., outputting a low electrical level). Correspondingly, in an embodiment of the present disclosure, a reset electrical level may be a low electrical level.

It should be understood that the method of triggering a CPU to wake or reset a single chip through a low electrical level as enumerated here is merely exemplary illustration, and a specific value of a reset electrical level is not particularly defined in the present disclosure. For example, a master system may also control a reset pin to output a low electrical level in a state where the single chip is in a working mode or a sleep mode, and when it is required to trigger the single chip to recover from the sleep mode to the working mode, the single chip is triggered to be waken or reset by means of pulling up an electrical level of the reset pin (i.e., outputting a high electrical level). In this case, a reset electrical level in an embodiment of the present disclosure may be a high electrical level.

Exemplarily, in an embodiment of the present disclosure, the low electrical level may be 0 V, and the high electrical level may be 1.8 V.

In an embodiment of the present disclosure, the control unit may trigger waking or resetting the single chip system according to the signal duration of the reset electrical level. A signal duration for triggering wakeup may be a duration greater than or equal to a preset first threshold value, and a signal duration for triggering a reset may be a duration greater than or equal to a preset second threshold value. That is, the single chip system is triggered to be waken when the signal duration of the reset electrical level is greater than or equal to the preset first threshold value, and the single chip system is triggered to be reset when the signal duration of the reset electrical level is greater than or equal to the preset second threshold value, where the first threshold value may be greater than the second threshold value.

The control unit may detect a reset electrical level signal in real time, and immediately send a wakeup instruction or a reset instruction (Method 1) once detecting that the reset electrical level reaches the preset first threshold value or the preset second threshold value; and the control unit may also detect a start time and an end time of the reset electrical level to determine a total signal duration of the reset electrical level so as to determine whether to send a wakeup instruction or a reset instruction (Method 2).

Method 1:

Optionally, the control unit is specifically configured to: send a wakeup instruction when it is detected during a first time period that the reset pin continuously outputs the reset electrical level, the wakeup instruction is used to trigger the CPU to wake the single chip system, where a start time of the first time period is a start time of the reset electrical level output by the reset pin, and a duration of the first time period is a preset first threshold value; and send a reset instruction when it is detected during a second time period that the reset pin continuously outputs the reset electrical level, the reset instruction including a first reset instruction and a second reset instruction, the first reset instruction is used to trigger the CPU to be reset, and the second reset instruction is used to trigger the peripheral to be reset, where a start time of the second time period is a start time of the reset electrical level output by the reset pin, and a duration of the second time period is a preset second threshold value.

Method 2:

Optionally, the control unit is specifically configured to: send a wakeup instruction when it is detected that a duration between a start time and an end time of the reset electrical level output by the reset pin is greater than or equal to a preset first threshold value and smaller than a preset second threshold value, the wakeup instruction is used to trigger the CPU to wake the single chip system, and the second threshold value is greater than the first threshold value; or send a reset instruction when it is detected that a duration between the start time and the end time of the reset electrical level output by the reset pin is greater than or equal to the second threshold value, the reset instruction including a first reset instruction and a second reset instruction, the first reset instruction is used to trigger the CPU to be reset, and the second reset instruction is used to trigger the peripheral to be reset.

Without loss of generality, by taking a reset electrical level being a low electrical level as an example, specific processes of triggering, by the control unit, to wake or reset a single chip system in Method 1 and Method 2 are described below in detail with reference to FIG. 2 (including FIG. 2a and FIG. 2b) and FIG. 3 (including FIG. 3a and FIG. 3b).

Figure 2A:
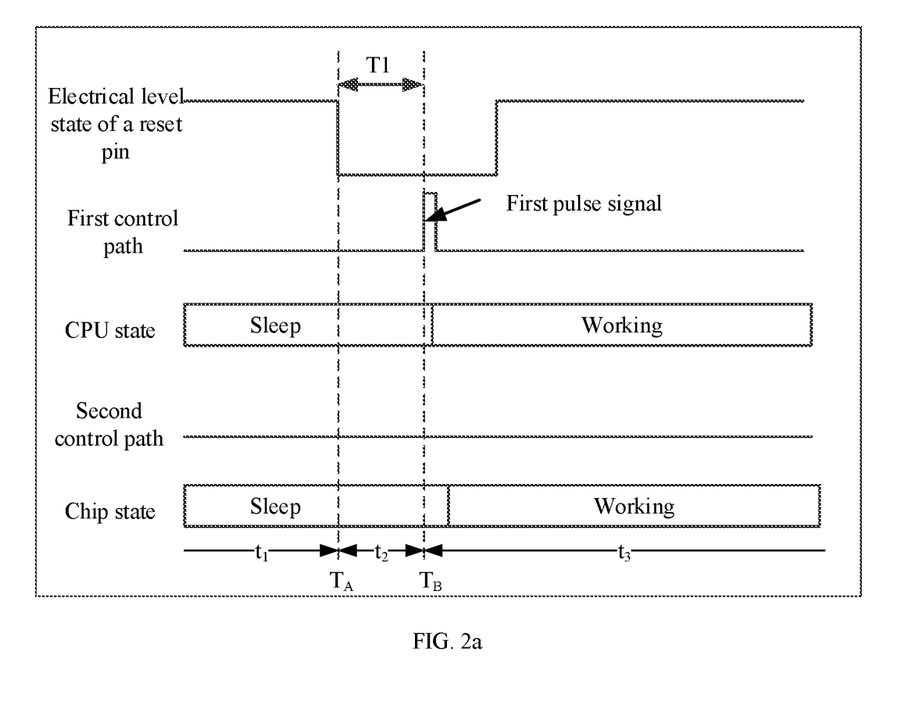
FIG. 2a and FIG. 2b are schematic diagrams of triggering, by a control unit, waking or resetting a single chip system according to an embodiment of the present disclosure.
Figure 2B:
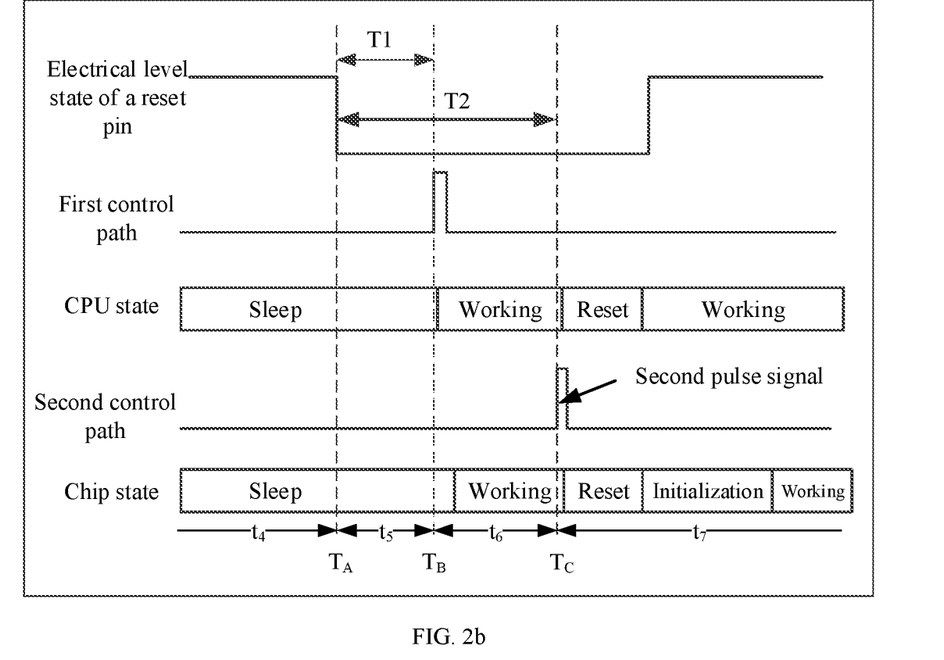

FIG. 2a and FIG. 2b are schematic diagrams of triggering, by the control unit, to wake or reset a single chip system in Method 1 according to an embodiment of the present disclosure.

FIG. 2a shows a specific process of triggering, by the control unit, a CPU to wake a single chip system. As shown in FIG. 2a, for convenience of understanding and description, the process may be divided into three time periods, i.e., $t_1$, $t_2$, and $t_3$, where a start time of the time period $t_1$ may be any time in a sleep mode, and an end time thereof may be a time (i.e., a time $T_A$ shown in the figure) when the control unit detects that an electrical level state of a reset pin is changed from a high electrical level state to a low electrical level state; a start time of the time period $t_2$ (i.e., an example of a first time period) may be the end time of the time period $t_1$, and a duration of the time period $t_2$ may be the preset first threshold value (i.e., $T_1$ shown in the figure); and a start time of the time period $t_3$ may be the end time (i.e., a time $T_B$ shown in the figure) of the time period $t_2$, and an end time of the time period $t_3$ may be any time after the single chip system re-enters a working mode.

Specifically, during the time period $t_1$, the control unit detects that the electrical state of the reset pin is in the high electrical level state, thus it can be determined that the single chip is in a working mode or has entered a sleep mode from the working mode.

During the time period $t_2$, the control unit may be used to firstly detect at the time $T_A$ that the electrical level state of the reset pin is changed from the high electrical level state to the low electrical level state, and thus it can be determined that it is required to make the single chip re-enter the working mode. The control unit continuously detects a signal duration of the low electrical level. It can be seen from the figure that the signal duration of the low electrical level is a width of a reset pulse.

It can be seen from the above description that a wakeup instruction is sent when a signal duration of the reset electrical level reaches the preset first threshold value (which may be corresponding to $T_1$ in the figure). In an embodiment of the present disclosure, the control unit detects the reset electrical level at the time $T_A$, and if the reset electrical level can be continuously detected during the time period from the time $T_A$ to a time $T_A+T_1$, the wakeup instruction is sent. Here, $T_A+T_1$ is a first detection time (which may be corresponding to $T_B$ in the figure).

In a possible embodiment, the control unit may include an internal gating counter, where the counter determines the signal duration of the low electrical level through counting. For example, a counting frequency of the counter is 1 megahertz (MHz), that is, a time interval between respective counts is 1 microsecond (μs). The signal duration of the low electrical level may be determined through a count of the counter.

During the time period $t_2$, if the control unit can continuously detect during a time period between the time $T_A$ and the time $T_B$ that the reset pin outputs a low electrical level, it may be considered that a signal duration of the low electrical level reaches the preset first threshold value (e.g., $T_1$ shown in the figure), and then a wakeup instruction may be sent to the CPU.

Optionally, the wakeup instruction may be a pulse signal (which is designated as a first pulse signal for convenience of differentiation and explanation). That is, at a time (i.e., the time $T_B$ shown in the figure) when the signal duration of the low electrical level reaches $T_1$, the control unit sends a pulse signal to the CPU via a control path.

During the time period $t_3$, if the CPU receives a wakeup instruction at the time $T_B$, the whole single chip system (or a chip) may be waken based on the wakeup instruction so that the single chip system is made to enter a working mode from a sleep mode. Since the single chip system enters the working mode until the CPU wakes the single chip system, a time when the single chip system enters the working mode is a little later than a time when the CPU enters a working mode, or has a certain time delay.

During the time period $t_3$, the control unit continues to detect the signal duration of the low electrical level, and timing (or counting) is stopped when it is detected that an electrical level state of the reset pin is changed from the low electrical level state to the high electrical level state. As such, the whole single chip system completes a process of entering a working mode from a sleep mode through wakeup.

FIG. 2b shows a specific process of triggering, by the control unit, to reset a single chip system. As shown in FIG. 2b, for convenience of understanding and description, the process may be divided into four time periods, i.e., $t_4$, $t_5$, $t_6$ and $t_7$, where a start time of the time period $t_4$ may be any time in a sleep mode, and an end time thereof may be a time (i.e., a time $T_A$ shown in the figure) when a control unit detects that an electrical level state of a reset pin is changed from a high electrical level state to a low electrical level state; a start time of the time period $t_5$ may be the end time of the time period $t_4$, and a duration of the time period $t_5$ may be a preset first threshold value (i.e., $T_1$ shown in the figure); a start time of the time period $t_6$ may be the end time (i.e., a time $T_B$ shown in the figure) of the time period $t_5$, and a duration of the time period $t_6$ may be a difference value between a preset second threshold value (i.e., $T_2$ shown in the figure) and the preset first threshold value (i.e., $T_1$ shown in the figure), or the sum (i.e., an example of a second time period) of the duration of the time period $t_5$ and the duration of the time period $t_6$ may be the preset second threshold value; and a start time of the time period $t_7$ may be an end time (i.e., a time $T_C$ shown in the figure) of the time period $t_6$, and an end time of the time period $t_7$ may be any time after the single chip system re-enters a working mode.

Specifically, specific processes of the time period $t_4$ and the time period $t_5$ are similar to specific processes of the time period $t_1$ and the time period $t_2$ described above, and for concision, they will not be described redundantly herein.

During the time period $t_6$, when the control unit can still continuously detect during a time period between the time $T_B$ and the time $T_C$ that a reset pin outputs a low electrical level, it is considered that a signal duration of the low electrical level reaches the preset second threshold value (e.g., $T_2$ shown in the figure), and thus a reset instruction may be sent. Specifically, the first reset instruction is sent to the CPU, and a second reset instruction is sent to the peripheral.

Optionally, the reset instruction may be a pulse signal, which is designated as a second pulse signal for convenience of differentiation and explanation. That is, at a time (i.e., the time $T_C$ shown in the figure) when the signal duration of the low electrical level is $T_2$, the control unit sends a second pulse signal to the CPU via a control path.

During the time period $t_7$, if the CPU and the peripheral respectively receive a first reset instruction and a second reset instruction at the time $T_B$, the CPU and the peripheral may be reset respectively based on the first reset instruction and the second reset instruction, so that the whole single chip system is reset globally and the single chip system is made to enter a working mode from a sleep mode. Therefore, a time when the single chip system enters a reset is a little later than a time when the CPU enters a reset, or has a certain time delay. The CPU enters a working mode after being reset, while the single chip system enters the working mode through a series of initialization states after being reset.

During the time period $t_7$, the control unit continues to detect the signal duration of the low electrical level, and timing (or counting) is stopped when it is detected that the electrical level state of the reset pin is changed from the low electrical level state to the high electrical level state. As such, the whole single chip system completes a process of entering a working mode from a sleep mode through a reset.

In an embodiment of the present disclosure, the second threshold value is optionally greater than the first threshold value.

That is to say, when the control unit firstly detects that a signal duration of the low electrical level reaches the preset first threshold value, a wakeup instruction may be sent, and at this time, if it is detected that the reset pin still continuously outputs the low electrical level, a reset instruction may be sent until the signal duration reaches the preset second threshold value.

It should be noted that a reset of a single chip will not be affected if the single chip is waken before being reset.

Figure 3A:
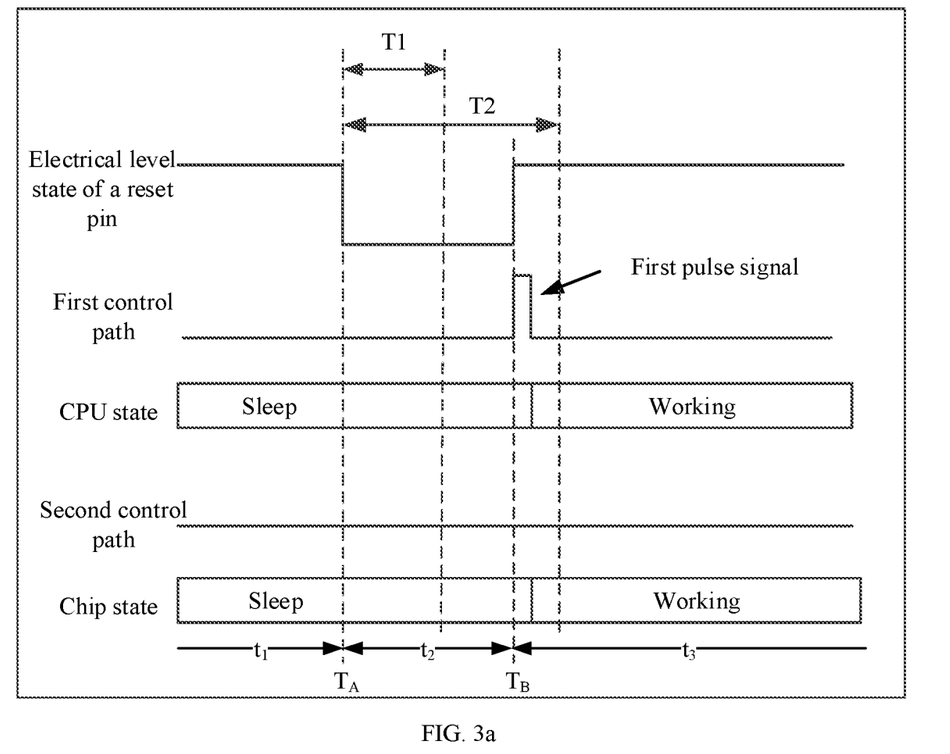
FIG. 3a and FIG. 3b are schematic diagrams of triggering, by a control unit, waking or resetting a single chip system according to another embodiment of the present disclosure.
Figure 3B:
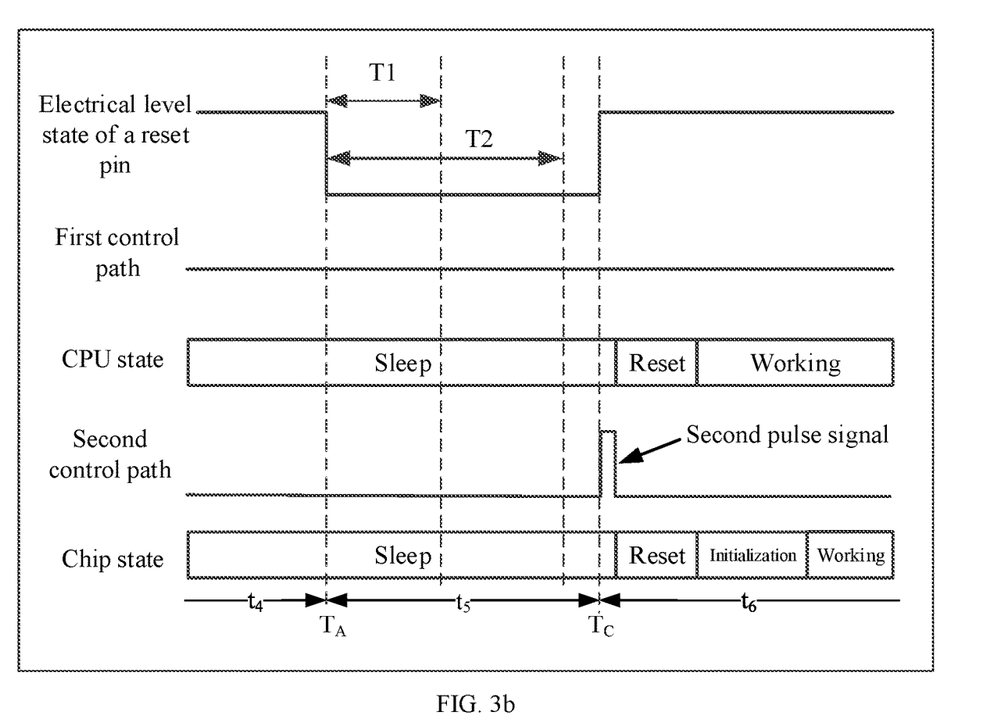

FIG. 3a and FIG. 3b are schematic diagrams of triggering, by the control unit, to wake or reset a single chip system in Method 2 according to an embodiment of the present disclosure.

FIG. 3a shows a specific process of triggering, by the control unit, a CPU to wake a single chip system. As shown in FIG. 3a, for convenience of understanding and description, the process may be divided into three time periods, i.e., $t_1$, $t_2$, and $t_3$, where a start time of the time period $t_1$ may be any time in a sleep mode, and an end time of the time period $t_1$ may be a time (i.e., a time $T_A$ shown in the figure) when the control unit detects that an electrical level state of a reset pin is changed from a high electrical level state to a low electrical level state; a start time of the time period $t_2$ may be the end time of the time period $t_1$, and an end time of the time period $t_2$ may be a time (i.e., a time $T_B$ shown in the figure) when the control unit detects that an electrical level state of the reset pin is changed from the low electrical level state to the high electrical level state; and a start time of the time period $t_3$ may be the end time (i.e., the time $T_B$ shown in the figure) of the time period $t_2$, and an end time of the time period $t_3$ may be any time after the single chip system re-enters a working mode. Specifically, during the time period $t_1$, from the fact that the control unit detects that the electrical state of the reset pin is in the high electrical level state, it can be determined that a single chip is in a working mode or enters a sleep mode from the working mode.

During the time period $t_2$, the control unit may be used to firstly detect at the time $T_A$ that the electrical level state of the reset pin is changed from the high electrical level state to the low electrical level state, and thus it can be determined that it is required to make the single chip re-enter the working mode. When the control unit detects at the time $T_B$ that the electrical level state of the reset pin is changed from the low electrical level state to the high electrical level state, a signal duration that the reset pin outputs the low electrical level state may be further determined. If it is determined that a duration of the time period $t_2$ is greater than or equal to a preset first threshold value and is smaller than a second threshold value, a wakeup instruction may be sent to a CPU.

During the time period $t_3$, if the CPU receives a wakeup instruction at the time $T_B$, the whole single chip system may be waken based on the wakeup instruction so that the single chip system is made to enter a working mode from a sleep mode. Since the single chip system enters the working mode until the CPU wakes the single chip system, a time when the single chip system enters the working mode is a little later than a time when the CPU enters a working mode, or has certain time delay.

During the time period $t_3$, the control unit continues to detect the signal duration of the low electrical level, and timing (or counting) is stopped when it is detected that an electrical level state of the reset pin is changed from the low electrical level state to the high electrical level state. As such, the whole single chip system completes a process of entering a working mode from a sleep mode through wakeup.

FIG. 3b shows a specific process of triggering, by the control unit, resetting a single chip system. As shown in FIG. 3a, for convenience of understanding and description, the process may be divided into three time periods, i.e., $t_4$, $t_5$, and $t_6$, where a start time of the time period $t_4$ may be any time in a sleep mode, and an end time of the time period $t_4$ may be a time (i.e., a time $T_A$ shown in the figure) when a control unit detects that an electrical level state of a reset pin is changed from a high electrical level state to a low electrical level state; a start time of the time period $t_5$ may be the end time of the time period $t_4$, and an end time of the time period $t_5$ may be a time (i.e., a time $T_C$ shown in the figure) when the control unit detects that the electrical level state of the reset pin is changed from the low electrical level state to the high electrical level state; and a start time of the time period $t_6$ may be the end time (i.e., the time $T_C$ shown in the figure) of the time period $t_5$, and an end time of the time period $t_6$ may be any time after the single chip system re-enters a working mode.

Specifically, during the time period $t_4$, from the fact that the control unit detects that the electrical state of the reset pin is in the high electrical level state, it can be determined that a single chip is in a working mode or enters a sleep mode from the working mode.

During the time period $t_5$, the control unit may be used to firstly detect at the time $T_A$ that the electrical level state of the reset pin is changed from the high electrical level state to the low electrical level state, and thus it can be determined that it is required to make the single chip re-enter the working mode. When the control unit detects at the time $T_C$ that the electrical level state of the reset pin is changed from the low electrical level state to the high electrical level state, a signal duration that the reset pin outputs the low electrical level state may be further determined. If it is determined that a duration of the time period $t_5$ is greater than or equal to a preset second threshold value, a reset instruction may be sent. Specifically, a first reset instruction is sent to a CPU, and a second reset instruction is sent to a peripheral.

During the time period $t_6$, if the CPU and the peripheral respectively receive a first reset instruction and a second reset instruction at the time $T_C$, the CPU and the peripheral may be reset respectively based on the first reset instruction and the second reset instruction, so that the whole single chip system is reset globally and the single chip system is made to enter a working mode from a sleep mode. Therefore, a time when the single chip system enters a reset is a little later than a time when the CPU enters a reset, or has certain time delay. The CPU enters a working mode after being reset, while the single chip system enters the working mode through a series of initialization states after being reset.

During the time period $t_6$, the control unit continues to detect a signal duration of the low electrical level, and timing (or counting) is stopped when it is detected that the electrical level state of the reset pin is changed from the low electrical level state to the high electrical level state. As such, the whole single chip system completes a process of entering a working mode from a sleep mode through a reset.

With the above two example methods, a control unit triggers waking or resetting a single chip system according to a signal duration of a reset electrical level, thus realizing a function of making the single chip system enter a working mode from a sleep mode by implementing wakeup or a reset with one reset pin.

In an embodiment of the present disclosure, a CPU may either receive a wakeup instruction or receive a reset instruction (specifically, a first reset instruction), may differentiate the wakeup instruction from the reset instruction through pulse signals of different forms, and may also transmit the wakeup instruction and the reset instruction via different control paths.

Optionally, the wakeup instruction is a first pulse signal, and the first reset instruction is a second pulse signal, the first pulse signal and the second pulse signal having different waveforms so as to differentiate the wakeup instruction from the first reset instruction.

Specifically, the control unit may output pulse signals of different waveforms (or different forms) (i.e., a first pulse signal and a second pulse signal having different waveforms) to differentiate the wakeup instruction from the first reset instruction. For example, the first pulse signal may be set as two continuous square waves, and the second pulse signal may be set as a square wave; or the first pulse signal may be a triangle wave, and the second pulse signal may be a square wave, and thus the first pulse signal may be differentiated from the second pulse signal so that the wakeup instruction is differentiated from the first reset instruction without respectively outputting instructions via two control paths.

It should be understood that the pulse signals of different waveforms as enumerated above are merely exemplary illustration, and should not set any limitation to the present disclosure, and the present disclosure likewise should not be limited to this. As long as a first pulse signal is differentiated from a second pulse signal through different waveforms so that whether a received signal is a wakeup instruction or a first reset instruction can be determined, it shall fall into the protection scope of the present disclosure.

Optionally, the wakeup instruction is a first pulse signal, the first reset instruction is a second pulse signal, the first pulse signal and the second pulse signal are the same, and the control unit is specifically configured to send the first pulse signal via a first control path, and send the second pulse signal via a second control path.

Specifically, referring again to FIG. 1, the control unit may send different instructions to the CPU via two different control paths, respectively, i.e., sending a wakeup instruction via a first control path, and sending a first reset instruction via a second control path. At a CPU side, different control paths are corresponding to different interfaces in a CPU, that is, whether the CPU is required to be waken or reset may be determined through an interface via which an instruction is received. Exemplarily, the first pulse signal and the second pulse signal may be square waves as shown in FIG. 2 and FIG. 3.

It should be understood that either the method of outputting the same pulse signal via different control paths or outputting different pulse signals via the same control path, and specific forms of the different pulse signals as enumerated above are merely exemplary illustration, and should not set any limitation to the present disclosure, and the present disclosure likewise should not be limited to this. For example, a control unit may also output different pulse signals via different control paths.

Figure 4:
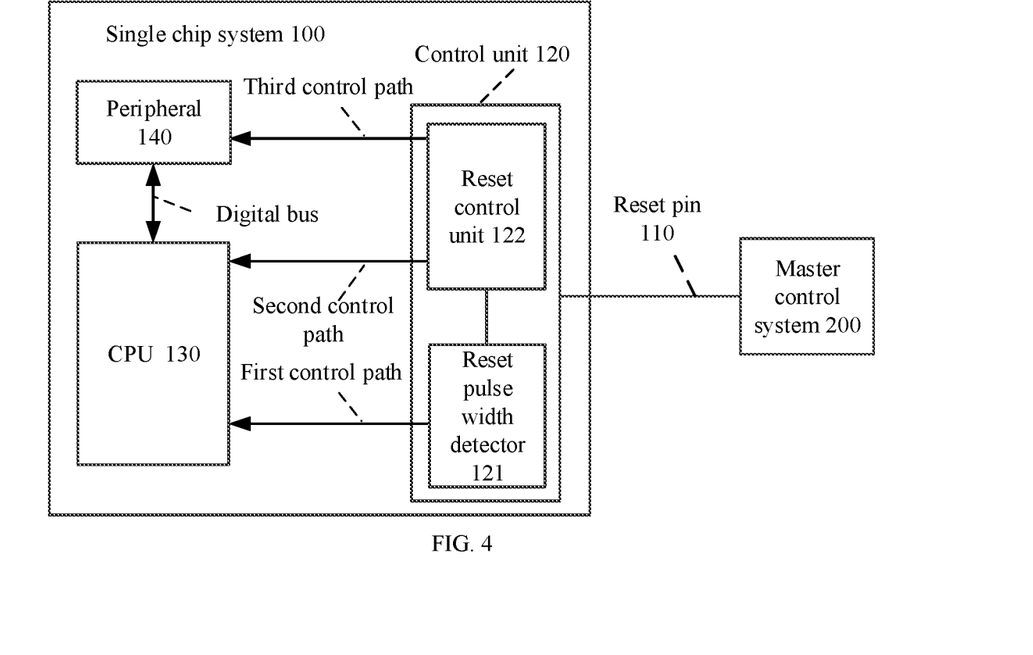
FIG. 4 is a schematic block diagram of a single chip system according to another embodiment of the present disclosure.

FIG. 4 shows a schematic block diagram of a single chip system 100 according to another embodiment of the present disclosure.

Optionally, as shown in FIG. 4, the control unit 120 in the single chip system 100 includes a reset pulse width detector 121 and a reset control unit 122. The reset pulse width detector may be connected to the CPU 130, and the reset control unit may be connected to the CPU 130 and the peripheral, respectively.

The reset pulse width detector 121 may be configured to: detect a signal duration of a reset electrical level output by the reset pin 110, and send a wakeup instruction to the CPU 130 according to the signal duration of the reset electrical level so as to trigger the CPU 130 to wake the single chip system 100, or send a third reset instruction to the reset control unit 122 so as to trigger the reset control unit 122 to reset the single chip system 100; and the reset control unit 122 may send a first reset instruction to the CPU 130 and send a second reset instruction to the peripheral 140 based on the third reset instruction.

It may be appreciated that there are many kinds of reset methods for a single chip, for example, a power on reset, a soft reset, etc. A reset control unit may be understood as a module that sends an instruction to a CPU after collecting all of reset instructions. In other words, the reset control unit may be understood as a global control module related to a reset.

Specifically, the reset pulse width detector 121 may send the wakeup instruction (e.g., a first pulse signal) to the CPU 130 via a first control path. The reset control unit 122 may send the first reset instruction (e.g., a second pulse signal) to the CPU 130 via a second control path so as to trigger the CPU 130 to be reset, and send the second reset instruction to the peripheral 140 via a third control path so as to trigger the peripheral 140 to be reset.

Therefore, in the single chip system of an embodiment of the present disclosure, by detecting, through a control unit, a signal duration of a reset electrical level, and sending a wakeup instruction or a reset instruction according to the signal duration so as to wake or reset a single chip system respectively, two functions of wakeup and reset may be realized simultaneously via one reset pin without increasing a system resource, thus saving system consumption and space of a PCB.

The single chip system according to the embodiments of the present disclosure may be explained above in detail with reference to FIG. 1 to FIG. 4. A reset method for a single chip according to an embodiment of the present disclosure can be explained below in detail with reference to FIG. 5.

Figure 5:
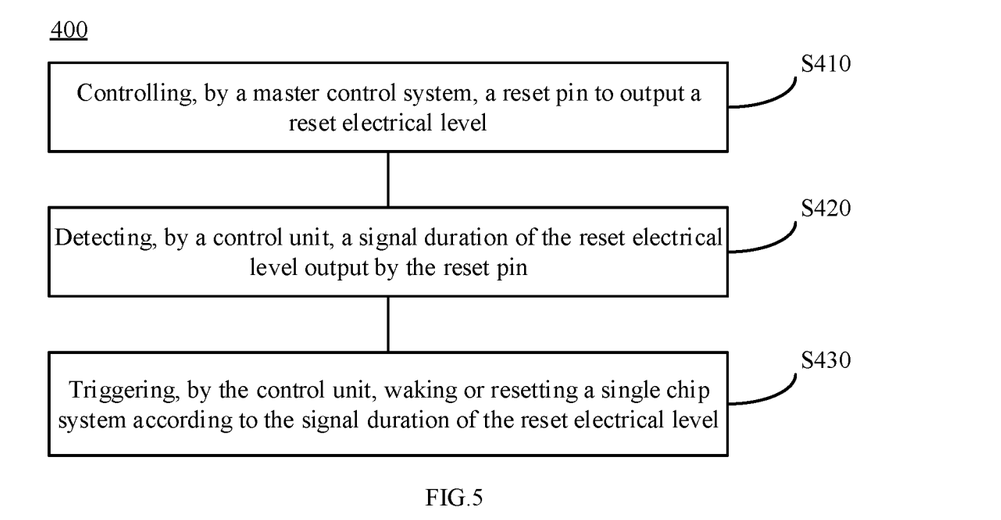
FIG. 5 is a schematic flowchart of a reset method for a single chip system according to an embodiment of the present disclosure.

FIG. 5 is a schematic flowchart of a reset method 400 for a single chip according to an embodiment of the present disclosure. The reset method 400 may be applied to a single chip system including a reset pin, a control unit, a central processing unit (CPU) and a peripheral, the single chip system is connected to a master control system via an end of the reset pin, the other end of the reset pin is connected to the control unit, and the control unit is connected to the CPU and the peripheral, respectively. Specifically, the reset method 400 may be executed by the single chip system 100 as described above.

As shown in FIG. 5, the reset method 400 includes:

S410, controlling, by the master control system, the reset pin to output a reset electrical level;

S420, detecting, by the control unit, a signal duration of the reset electrical level output by the reset pin; and S430, triggering, by the control unit, to wake or reset the single chip system according to the signal duration of the reset electrical level, where a signal duration for triggering wakeup is different from a signal duration for triggering a reset.

Optionally, the S430, triggering, by the control unit, to wake or reset the single chip system according to the signal duration of the reset electrical level includes:

sending, by the control unit, a wakeup instruction when it is detected during a first time period that the reset pin continuously outputs the reset electrical level, the wakeup instruction is used to trigger the CPU to wake the single chip system, where a start time of the first time period is a start time of the reset electrical level output by the reset pin, and a duration of the first time period is a preset first threshold value; and sending, by the control unit, a reset instruction when it is detected during a second time period that the reset pin continuously outputs the reset electrical level, the reset instruction including a first reset instruction and a second reset instruction, the first reset instruction is used to trigger the CPU to be reset, and the second reset instruction is used to trigger the peripheral to be reset, where a start time of the second time period is a start time of the reset electrical level output by the reset pin, and a duration of the second time period is a preset second threshold value. Optionally, in the S430, triggering, by the control unit, to wake or reset the single chip system according to the signal duration of the reset electrical level includes:

sending, by the control unit, a wakeup instruction when it is detected that a duration between a start time and an end time of the reset electrical level output by the reset pin is greater than or equal to a preset first threshold value and smaller than a preset second threshold value, the wakeup instruction is used to trigger the CPU to wake the single chip system, and the second threshold value is greater than the first threshold value; or sending a reset instruction when it is detected that a duration between the start time and the end time of the reset electrical level output by the reset pin is greater than or equal to the second threshold value, the reset instruction including a first reset instruction and a second reset instruction, the first reset instruction is used to trigger the CPU to be reset, and the second reset instruction is used to trigger the peripheral to be reset.

Optionally, the wakeup instruction is a first pulse signal, and the first reset instruction is a second pulse signal, the first pulse signal and the second pulse signal are different with each other.

Optionally, the wakeup instruction is a first pulse signal, and the first reset instruction is a second pulse signal, the first pulse signal and the second pulse signal are the same; and the sending the wakeup instruction includes:

sending the first pulse signal via a first control path; and the sending the first reset instruction includes:

sending the second pulse signal via a second control path.

Optionally, the control unit includes a reset pulse width detector and a reset control unit, and the S420, detecting, by the control unit, the signal duration of the reset electrical level output by the reset pin includes:

detecting, by the reset pulse width detector, the signal duration of the reset electrical level output by the reset pin; and the S430, triggering, by the control unit, to wake or reset the single chip system according to the signal duration of the reset electrical level includes:

sending, by the reset pulse width detector, a wakeup instruction to the CPU according to the signal duration of the reset electrical level so as to trigger the CPU to wake the single chip system, or sending a third reset instruction to the reset control unit so as to trigger the reset control unit to reset the single chip system; and sending, by the reset control unit, a first reset instruction to the CPU and sending a second reset instruction to the peripheral based on the third reset instruction, the first reset instruction is used to trigger the CPU to be reset, and the second reset instruction is used to trigger the peripheral to be reset. Therefore, in the reset method for a single chip system of an embodiment of the present disclosure, by detecting, by a control unit, a signal duration of a reset electrical level, and sending a wakeup instruction or a reset instruction according to the signal duration so as to determine to wake or reset a single chip system, two functions of wakeup and reset are realized simultaneously via one reset pin without increasing a system resource, thus saving system consumption and space of a PCB.

It should be understood that respective steps or procedures in the reset method 400 for a single chip according to an embodiment of the present disclosure may correspond to the above or other operations and/or functions of various modules of the single chip system 100 of an embodiment of the present disclosure, and for concision, they will not be described redundantly herein.

It should be understood that, in various embodiments of the present disclosure, values of sequence numbers of the above-mentioned various processes do not mean an order of execution which should be determined based upon functionalities and internal logics thereof, rather than setting any limitation to implementation processes of the embodiments of the present disclosure.

A person of ordinary skill in the art may be aware that, units and algorithm steps of the examples described with reference to the embodiments disclosed in the text may be implemented by electronic hardware or a combination of computer software and the electronic hardware. Whether these functions are executed in a manner of hardware or software depends on the specific applications and design constraints of the technical solution. A person skilled may implement the described functions by using different methods for each specific application, but this implementation should not be considered to be beyond the scope of the present disclosure.

A person skilled in the art may clearly understand that, for convenience and simplicity of description, the specific working processes of the system, the apparatus and the units described above may refer to corresponding processes in the foregoing method embodiments, which will not be described redundantly herein.

In several embodiments provided in the present application, it should be understood that, the disclosed system, apparatus and method may be implemented in other manners. For example, the apparatus embodiments described above are merely exemplary, e.g., the division of the units is merely a logic function division, and other division manners may exist in practical implementation, for example, a plurality of units or components may be combined or integrated to another system, or some features may be omitted or be not executed. From another point of view, the displayed or discussed mutual coupling or direct coupling or communication connection may be indirect coupling or communication connection of apparatuses or units through some interfaces, and may also be in electrical, mechanical or other forms.

The units described as separate parts may be or may not be separated physically, and a component displayed as a unit may be or may not be a physical unit, namely, may be located in one place, or may be distributed on a plurality of network units. A part of or all of the units may be selected to achieve the purposes of the solutions in the present embodiments according to actual needs.

In addition, in various embodiments of the present disclosure, the respective functional units may be integrated in one processing unit, or the respective functional units may physically exist separately, or two or more units may be integrated in one unit.

If the functional units are implemented in the form of the software functional unit and is sold or used as an independent product, it may be stored in a computer readable storage medium. Based on such an understanding, the technical solution of the present disclosure substantially, or the part of the present disclosure making contribution to the related art, or a part of the technical solution may be embodied in the form of a software product, and the computer software product is stored in a storage medium, which includes multiple instructions enabling a computer device (which may be a personal computer, a server, a network device or the like) to execute all of or a part of the steps of the methods in the respective embodiments of the present disclosure. In addition, the foregoing storage medium includes a variety of media capable of storing program codes, such as a USB disk, a mobile hard disk, a read-only memory (ROM, Read-Only Memory), a random access memory (RAM, Random Access Memory), a magnetic disk, an optical disk or the like.

Described above is the specific embodiments of the present disclosure only, but the protection scope of the present disclosure is not limited to this, a person skilled who is familiar with the present technical field could readily think of variations or substitutions within the technical scope disclosed by the present disclosure, and these variations or substitutions shall be encompassed within the protection scope of the present disclosure. Therefore, the protection scope of the present disclosure shall be defined by the claims.

The invention claimed is:

1. A single chip system, comprising:
a reset pin;
a control unit;
a central processing unit CPU; and
a peripheral;
wherein the single chip system is connected to a master control system via an end of the reset pin, the other end of the reset pin is connected to the control unit, and the control unit is connected to the CPU and the peripheral,
wherein the master control system is configured to control the reset pin to output a reset electrical level;
the control unit is configured to:
send a wakeup instruction when it is detected during a first time period that the reset pin continuously outputs the reset electrical level, wherein the wakeup instruction is configured to trigger the CPU to wake the single chip system, a start time of the first time period is a start time of the reset electrical level output by the reset pin, and a duration of the first time period is a preset first threshold value; and
send a reset instruction when it is detected during a second time period that the reset pin continuously outputs the reset electrical level, the reset instruction comprising a first reset instruction and a second reset instruction, wherein the first reset instruction is configured to trigger the CPU, the second reset instruction is configured to trigger the peripheral, a start time of the second time period is the same as the start time of the first time period, and a duration of the second time period is a preset second threshold value, the second threshold value is greater than the first threshold value.

2. The single chip system according to claim 1, wherein the wakeup instruction is a first pulse signal, and the first reset instruction is a second pulse signal, the first pulse signal and the second pulse signal having different waveforms so as to differentiate the wakeup instruction from the first reset instruction; or the first pulse signal and the second pulse signal are the same, and the control unit is configured to send the first pulse signal via a first control path, and send the second pulse signal via a second control path.

3. The single chip system according to claim 1, wherein the control unit comprises a reset pulse width detector and a reset control unit,
the reset pulse width detector is configured to: detect the signal duration of the reset electrical level output by the reset pin, and send a wakeup instruction to the CPU according to the signal duration of the reset electrical level so as to trigger the CPU to wake the single chip system, or send a third reset instruction to the reset control unit so as to trigger the reset control unit to reset the single chip system.

4. The single chip system according to claim 3, wherein the reset control unit is configured to:
send a first reset instruction to the CPU and send a second reset instruction to the peripheral based on the third reset instruction, the first reset instruction is configured to trigger the CPU, and the second reset instruction is configured to trigger the peripheral.

5. A reset method for a single chip system, wherein the single chip system comprises: a reset pin, a control unit, a central processing unit CPU and a peripheral, the single chip system is connected to a master control system via an end of the reset pin, the other end of the reset pin is connected to the control unit, and the control unit is connected to the CPU and the peripheral; and the reset method comprises:
controlling, by the master control system, the reset pin to output a reset electrical level;
detecting, by the control unit, a signal duration of the reset electrical level output by the reset pin;
sending, by the control unit, a wakeup instruction when it is detected during a first time period that the reset pin continuously outputs the reset electrical level, the wakeup instruction is configured to trigger the CPU to wake the single chip system, wherein a start time of the first time period is a start time of the reset electrical level output by the reset pin, and a duration of the first time period is a preset first threshold value; and
sending, by the control unit, a reset instruction when it is detected during a second time period that the reset pin continuously outputs the reset electrical level, the reset instruction comprising a first reset instruction and a second reset instruction, the first reset instruction is configured to trigger the CPU, and the second reset instruction is configured to trigger the peripheral, wherein a start time of the second time period is the same as the start time of the first time period, and a duration of the second time period is a preset second threshold value, the second threshold value is greater than the first threshold value.

6. The reset method according to claim 5, wherein the wakeup instruction is a first pulse signal, and the first reset instruction is a second pulse signal, the first pulse signal and the second pulse signal having different waveforms so as to differentiate the wakeup instruction from the first reset instruction.

7. The reset method according to claim 5, wherein the wakeup instruction is a first pulse signal, and the first reset instruction is a second pulse signal, the first pulse signal and the second pulse signal are the same;
   the sending the wakeup instruction comprises:
   sending the first pulse signal via a first control path; and
   the sending the first reset instruction comprises:
   sending the second pulse signal via a second control path.

8. The reset method according to claim 5, wherein the control unit comprises a reset pulse width detector and a reset control unit;
   the detecting, by the control unit, the signal duration of the reset electrical level output by the reset pin comprises:
   detecting, by the reset pulse width detector, the signal duration of the reset electrical level output by the reset pin; and
   the triggering, by the control unit, to wake or reset the single chip system according to the signal duration of the reset electrical level comprises:

sending, by the reset pulse width detector, the wakeup instruction to the CPU according to the signal duration of the reset electrical level so as to trigger the CPU to wake the single chip system, or sending a third reset instruction to the reset control unit so as to trigger the reset control unit to reset the single chip system; and sending, by the reset control unit, a first reset instruction to the CPU and sending a second reset instruction to the peripheral based on the third reset instruction, the first reset instruction is configured to trigger the CPU, and the second reset instruction is configured to trigger the peripheral.

\* \* \* \* \*